United States Patent [19]

Takahashi

[11] Patent Number: 4,980,313

[45] Date of Patent: Dec. 25, 1990

[54] METHOD OF PRODUCING A SEMICONDUCTOR LASER

[75] Inventor: Shogo Takahashi, Itami, Japan

[73] Assignee: Mitsubishi Denki Kabushiki Kaisha, Japan

[21] Appl. No.: 461,293

[22] Filed: Jan. 5, 1990

[30] Foreign Application Priority Data

Jan. 24, 1989 [JP] Japan .................................. 1-15735

[51] Int. Cl.⁵ ...................... H01L 21/20; H01L 21/22
[52] U.S. Cl. .......................... 437/129; 148/DIG. 15; 148/DIG. 95; 148/DIG. 151; 148/DIG. 160; 372/96; 437/110; 437/133; 437/152; 437/161; 437/953; 437/987
[58] Field of Search .................. 148/DIG. 3, 4, 5, 15, 148/30, 37, 56, 65, 72, 84, 95, 110, 119, 151, 160, 169; 156/610–614; 357/16, 17; 372/43, 46, 48, 50, 96; 437/22, 23, 27, 81, 108, 110, 126, 129, 133, 150, 151, 149, 152, 154, 160, 161, 247, 936, 953

[56] References Cited

U.S. PATENT DOCUMENTS

| | | | |
|---|---|---|---|
| 4,378,255 | 3/1983 | Holonyak, Jr. et al. | 437/81 |
| 4,654,090 | 3/1987 | Burnham et al. | 437/81 |
| 4,727,557 | 2/1988 | Burnham et al. | 357/17 |
| 4,752,934 | 6/1988 | Fukuzawa et al. | 372/46 |
| 4,771,010 | 9/1988 | Epler et al. | 437/129 |
| 4,786,951 | 11/1988 | Tokuda et al. | 357/17 |
| 4,810,670 | 3/1989 | Furuyama et al. | 437/129 |
| 4,824,798 | 4/1989 | Burnham et al. | 437/110 |
| 4,827,483 | 5/1989 | Fukuzawa et al. | 372/46 |
| 4,888,781 | 12/1989 | Omura et al. | 372/46 |

FOREIGN PATENT DOCUMENTS

0202677 11/1984 Japan .
0171184 8/1986 Japan .................................. 372/46
0236184 10/1986 Japan .................................. 372/46

OTHER PUBLICATIONS

Fukuzawa et al., "GaAlAs Buried Multiquartum Well Lasers . . . ", Apl. Phys. Lett., 45(1), Jul. 1, 1984, pp. 1–3.

Meehan et al., "Diorder of an $Al_xGa_{1-x}As$–GaAs Superlattice by Donor Diffusion", Appl. Phys. Lett., 45, No. 5, Sep. 1, 1984, pp. 549–551.

Guido et al., "Coupled-Stripe . . . Lasers Defined by Vacancy-Enhanced Impernty Induced Disordering . . . ", Appl. Phys. Lett., 50(12), Mar. 23, 1987, pp. 757–759.

"AlGaAs MQW Laser . . . Epi-Layer", Autumn Meeting of Japanese Association of Applied Physics of 1987, 18a-ZR-9.

Primary Examiner—Olik Chaudhuri
Assistant Examiner—William Bunch
Attorney, Agent, or Firm—Leydig, Voit & Mayer

[57] ABSTRACT

A method of producing a semiconductor laser including deposition a first film as a source of n type impurities on a portion of a semiconductor structure produced by growing at least a p type lower cladding layer, a quantum well active layer, and an n type upper cladding layer successively on a substrate, depositing a second film as a source of p type impurities at least on the surface of the semiconductor structure on both sides of and on the first film and annealing to diffuse p and n type impurities at the same time, thereby disordering portions of the quantum well except for the portion becoming an active region with p type impurities reaching at least the p type lower cladding layer, n type impurities reverting the portions of the n type cladding layer to which p type impurities have diffused to n type, and the n type impurities reaching the n type cladding layer but not reaching the active layer.

8 Claims, 2 Drawing Sheets

METHOD OF PRODUCING A SEMICONDUCTOR LASER

FIELD OF THE INVENTION

The present invention relates to a method of producing a semiconductor laser and, more particularly, to producing a broad width n side electrode regardless, of the active region width in a planar type semiconductor laser.

BACKGROUND OF THE INVENTION

FIG. 2 shows a cross-sectional view of a prior art planar type quantum well laser utilizing p type impurity diffusion described in Prescript No. 18a-ZRof 1987 Autumn Meeting of Japanese Society of Applied Physics.

In FIG. 2, reference numeral 1 designates a semi-insulating GaAs substrate. A P type AlGaAs lower cladding layer 2 is disposed on GaAs substrate 1. A Multi-quantum well (hereinafter referred to as MQW) layer 3, the active layer is disposed on the p type AlGaAs lower cladding layer 2. An n type AlGaAs upper cladding layer 4 is disposed on MQW layer 3. An n type GaAs contact layer 5 is disposed on the n type AlGaAs upper cladding layer 4. Reference numeral 6 designates Zn diffusion regions. P side electrodes 7 are disposed on the Zn diffusion regions 6. An n side electrode 8 is disposed on the n type GaAs contact layer 5. Reference numeral 30 designates an MQW layer disordered by Zn diffusion.

The production process will be described.

First of all, a p type AlGaAs layer 2, an MQW layer 3 an n type AlGaAs layer 4, and an n type GaAs contact layer 5 are successively grown on a semi-insulating GaAs substrate 1. There after, zinc is selectively diffused into the structure, leaving the MQW layer 3 in a stripe configuration. Thereafter, the pn junction portion of the contact layer 5 is etched and removed, and a p and an n side electrode 7 and 8 are deposited, thereby completing a semiconductor laser.

The operation will be described.

The MQW 30 in the zinc diffused region 6 is disordered so that the AlGaAs has a larger band gap than that of the well layer of the MQW. A current flowing into the device from the p side electrode 7 is injected into the MQW layer 3 which is not disordered, thereby to generate light. The diffusion voltage of the MQW layer 3 is lower than that of the upper and lower AlGaAs layers 2 and 4. By narrowing the width of the light emission region sufficiently, a stable single mode oscillation is obtained and a low threshold current is obtained. Further, in this structure, both the p and n side electrodes are disposed on the same surface of the device and the therebetween is small enough for use in an integrated circuit.

The prior art planar type p diffusion quantum well laser is produced as described above. When the light emission region width is narrowed, the production of the n side electrode becomes difficult, limiting the reduction of the threshold current.

SUMMARY OF THE INVENTION

It is an object of the present invention to provide a method of producing a semiconductor laser device with a reduced threshold current by narrowing the light emission region width in a simplified process.

Other objects and advantages of the present invention will become apparent from the detailed description given hereinafter; it should be understood, however, that the detailed description and specific embodiment are given by way of illustration only, since various changes and modifications within the spirit and acope of the invention will become apparent to those skilled in the art form this detailed description.

According to the present invention, a first film that becomes an n type diffusion source is produced in a stripe configuration on a semiconductor wafer by growing at least a p type cladding layer, a quantum well active layer, and an n type cladding layer successively on a substrate, a second film that becomes a p type diffusion source is produced on the entire surface of wafer. During an annealing to step, p type and n type diffusion occurs at the same time, and portions of the quantum well, except for a portion which is to become an active region are disordered by diffusion of p type impurities that reach the p type lower cladding layer. A portion of the n type upper cladding layer which has become p type by the p type diffusion reverts to n type when the n type impurities reach the n type upper cladding layer but not the active layer. Therefore, a broad width n side electrode can be provided with a narrow width light emission region.

DETAILED DESCRIPTION OF THE PREFERRED EMBODIMENTS

An embodiment of the present invention will be described in detail with reference to the drawings.

Figure 1:
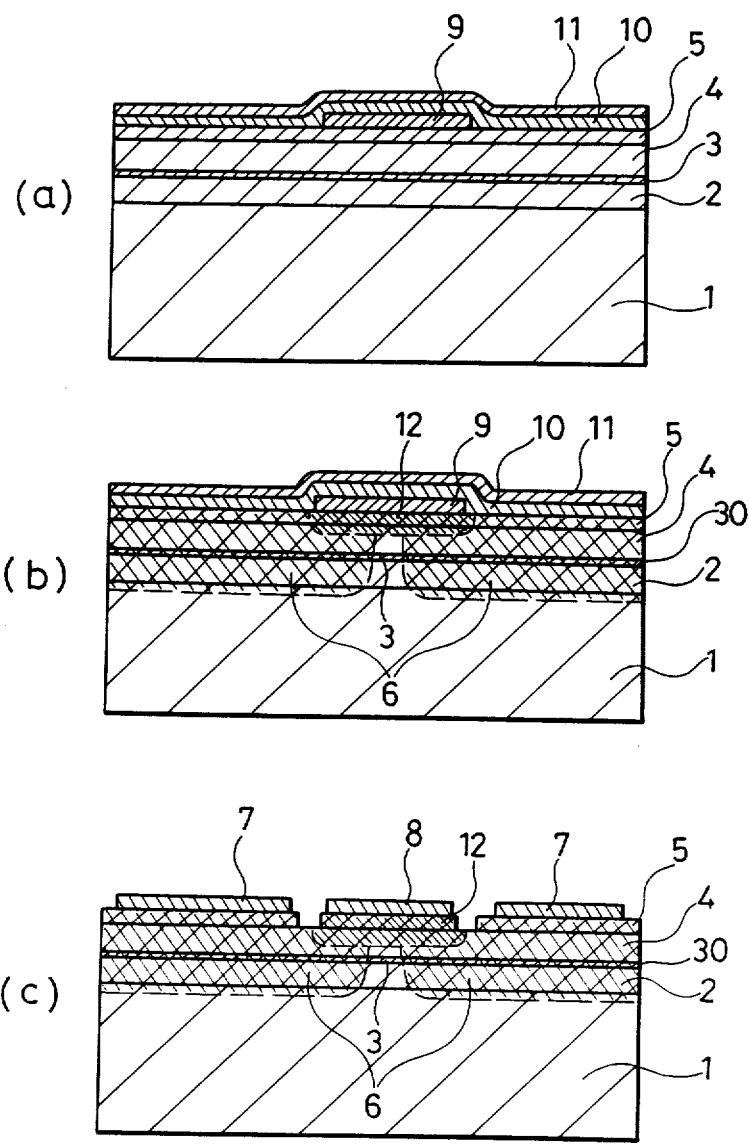
FIGURES 1(a), 1(b), and 1(c) are cross-sectional views of a method of producing a semiconductor laser device according to an embodiment of the present invention.
Figure 2:
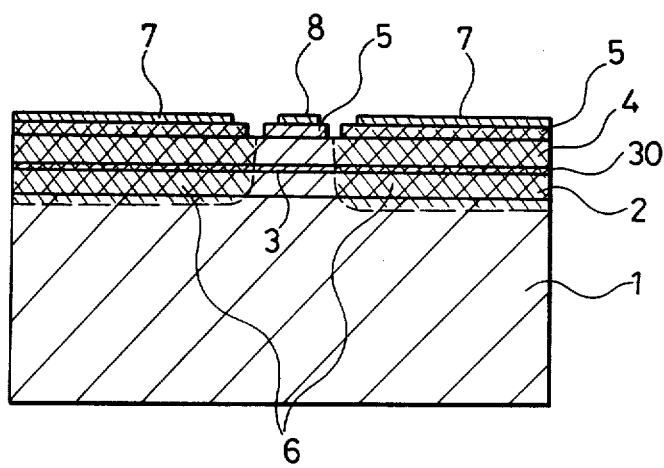
FIG. 2 is a cross-sectional views a semiconductor laser device according to the prior art.

FIG. 1(a) to 1(c) show cross-sectional views for explaining a production method of a semiconductor laser according to the present invention. The same reference numerals designate the same or corresponding elements as those shown in FIG. 2. Reference numeral 9 designates a silicon film, reference numeral 10 designates a film comprising ZnO and SiO$_2$, and reference numeral 11 designates a SiO$_2$ film which is used as a diffusion cap layer. Reference numeral 12 designates an n type diffusion region.

The production process will be described.

First of all, a p type AlGaAs lower cladding layer 2, an AlGaAs series MQW active layer 3, an n type AlGaAs upper cladding layer 4, an n type GaAs contact layer 5 are successively epitaxially grown on a semi-insulating GaAs substrate 1 by MOCVD or MBE. Next, a silicon film 9 is deposited on the wafer by sputtering or electron beam deposition. The silicon film 9 is patterned in a stripe configuration of about 50 microns wide. Subsequently, the film 10 comprising a mixture of ZnO and SiO$_2$ is deposited on cladding layer 5 and silicon film 9. A diffusion cap film 11 comprising SiO$_2$ is deposited on film 10 to produce the structure of FIG. 1(a). Next, by annealing, p and n diffusions are carried out.

The p diffusion proceeds from the ZnO:SiO$_2$film 10 and the n diffusion proceeds from the silicon film 9. Under the same annealing conditions, for example, a diffusion temperature of 850° C. and diffusion time of 1 hour, Zn diffuses by 10 microns and Si diffuses 1 micron, because of the lower speed of the n type diffusion compared to the p type diffusion. Accordingly, by annealing under appropriate conditions, it is possible to limit the n type diffusion 12 to the layer 4 above the MQW layer 3 and the p type diffusion 6 within the substrate at the same time. Furthermore, because the silicon film 9 functions as a mask against zinc diffusion from the ZnO:SiO$_2$ film 10, zinc is not diffused into layer 4 opposite the silicon film 9 but diffuses in the transverse direction from the ZnO:SiO$_2$ film 10 at both sides of the stripe configuration silicon film 9 and under the silicon film 9. Furthermore, in this embodiment, the n type GaAs layer 5 and n type AlGaAs layer 4 which has become p type due to the zinc diffusion revert to n type, where silicon diffuses into them from the silicon film 9. The composition ratio of ZnO to SiO$_2$ of the ZnO:SiO$_2$ film 10 and the film thicknesses of the silicon film 9 and the ZnO:SiO$_2$ film 10 should be established such that the n type diffusion density becomes higher than the p type diffusion density.

By diffusing p type impurities and n type impurities at the same time while controlling the above-described conditions appropriately, portions of the MQW layer 30, except for a portion about 2 microns wide, and also portions of the n type GaAs layer 5 and the n type AlGaAs layer below the silicon film 9 which have become p type due to the zinc diffusion revert to n type, thereby producing an n type region on which n side electrode 8 can be deposited. Thereafter, the SiO$_2$ film 11 and ZnO:SiO$_2$ film 10, and Si film 9 are removed and the pn junction portions of the contact layer 5 are etched and removed, and the n side electrode 8 and p side electrode 7 are deposited thereon by such as sputtering, thereby completing the device shown in FIG. 1(c).

In this embodiment, the width of the active region can be narrowed without concern for the production of the n side electrode. Thereby, the n side electrode production region can be broadened and the production process for the n side electrode can be quite simplified.

While in the above-illustrated embodiment a silicon film is used as the n type diffusion source and a ZnO:SiO$_2$ film is used as the p type diffusion source, a compound of S can be used as the n type diffusion source and Cd or cadmium oxide can be used as the p type diffusion source. Furthermore, although an MQW layer is used for the active layer, a single quantum well layer can be used therefor.

As is evident from the foregoing description, according to the present invention, a film becoming an n type diffusion source and a film becoming a p type diffusion source are produced on a wafer and thereafter annealed. A p type diffusion and n type diffusion are conducted at the same time, and portions of the quantum well, except for the portion which is to become the active region, are disordered by p type diffusion which has a relatively high diffusion speed and can reach at least the p type lower cladding layer and which has low diffusion density, thereby producing a light emission region having a narrow width. Further, a portion of the n type cladding layer to which p type impurities are diffused by the p type diffusion is made n type by the n type diffusion which has a relatively low diffusion speed and can only reach the n type cladding layer and which has a high diffusion density, thereby producing an n type electrode production region. Thus, a low threshold current laser which has a narrow light emission region width and a wide width n side electrode can be produced by a simplified process.

What is claimed is:

1. A method of producing a semiconductor laser comprising:
   growing at least a p type lower cladding layer, a quantum well active layer, and an type upper cladding layer successively on a substrate;
   depositing a first film as a source for diffusion of n type impurities on a portion of the n type upper cladding layer;
   depositing a second film as a source for diffusion of p type impurities at least on the upper cladding layer on opposite sides of the first film; and
   annealing to diffuse p and n type impurities at the same time, thereby to disorder portions of the quantum well except for a portion becoming the active region of the laser with p type impurities reaching the p type lower cladding layer, n type impurities reverting portions of the n type cladding layer to which p type impurities have diffused to n type, and n type impurities entering the n type upper cladding layer but not reaching the active layer.

2. The method of claim 1 including depositing silicon as the first film.

3. The method of claim 2 including depositing a mixture of ZnO and SiO$_2$ as the second film.

4. The method of claim 1 wherein said active layer comprises multi-quantum well structure.

5. The method of claim 1 wherein said active layer comprises single quantum well structure.

6. The method of claim 1 including depositing an SiO$_2$ film on the second film before annealing.

7. The method of claim 1 wherein the p type lower cladding layer comprises AlGaAs, the quantum well active layer comprises AlGaAs, the n type upper cladding layer comprises AlGaAs and the substrate comprises GaAs.

8. The method of claim 7 including growing an n type GaAs contact layer on said n type AlGaAs upper cladding layer before depositing said first film.

* * * * *

UNITED STATES PATENT AND TRADEMARK OFFICE
CERTIFICATE OF CORRECTION

PATENT NO. : 4,980,313

DATED : December 25, 1990

INVENTOR(S) : Shogo Takahashi

It is certified that error appears in the above-identified patent and that said Letters Patent is hereby corrected as shown below:

ON TITLE PAGE:
In item [57] Abstract, line 2, change "deposition" to --depositing--.

Column 4, line 18, after "an" insert --n--.

Signed and Sealed this

Twenty-third Day of June, 1992

Attest:

DOUGLAS B. COMER

*Attesting Officer*     *Acting Commissioner of Patents and Trademarks*

UNITED STATES PATENT AND TRADEMARK OFFICE
CERTIFICATE OF CORRECTION

PATENT NO. : 4,980,313
DATED : March 13, 1990
INVENTOR(S) : Satoh, et. al.

It is certified that error appears in the above-identified patent and that said Letters Patent is hereby corrected as shown below:

On the title page, assignee should read

[73] Assignees: Nitto Kagaku Kogyo Kabushiki Kaisha,

Mitsubishi Rayon Co., Ltd. both of Japan.

Signed and Sealed this

Eighteenth Day of August, 1992

*Attest:*

DOUGLAS B. COMER

*Attesting Officer*  *Acting Commissioner of Patents and Trademarks*